United States Patent
Mieda et al.

(10) Patent No.: US 6,229,387 B1
(45) Date of Patent: May 8, 2001

(54) OUTPUT SIGNAL CONVERTER FOR AMPLICIATION OR ATTENUATION OF TUBE AMPLIFIER OUTPUT WHILE MAINTAINING OUTPUT PROPERTIES

(75) Inventors: Fumio Mieda, Tokorozawa; Yasuhiko Mori, Toride; Hirofumi Mitoma, Kawasaki, all of (JP)

(73) Assignee: KORG, Inc., Tokyo (JP)

( * ) Notice: Subject to any disclaimer, the term of this patent is extended or adjusted under 35 U.S.C. 154(b) by 0 days.

(21) Appl. No.: 09/695,940

(22) Filed: Oct. 25, 2000

Related U.S. Application Data (62) Division of application No. 09/200,102, filed on Nov. 24, 1998, now Pat. No. 6,175,271.

(30) Foreign Application Priority Data

Dec. 4, 1997 (JP) .................................................... 9-348729
Jul. 14, 1998 (JP) .................................................... 10-199038

(51) Int. Cl.[7] .................................................... H03F 5/00
(52) U.S. Cl. .................................................... 330/3; 330/288
(58) Field of Search .................................................... 330/3, 165, 195, 330/288, 124 R, 295; 381/120

(56) References Cited

U.S. PATENT DOCUMENTS 5,734,725 * 3/1998 Pritchard ................................ 381/61
5,909,145 * 6/1999 Zimmerman ............................ 330/128
6,175,271 * 1/2001 Mieda et al. .............................. 330/3

FOREIGN PATENT DOCUMENTS 12-31754 * 1/2000 (JP).

* cited by examiner

*Primary Examiner*—Steven J. Mottola
(74) *Attorney, Agent, or Firm*—Michael J. Striker (57) ABSTRACT

The output signal converter for a tube amplifier includes semiconductor devices for amplifying or attenuating an output signal of the tube amplifier while maintaining the output properties of the tube amplifier. The output signal converter according to one embodiment has an output transformer (TR) having an input terminal (TRa); a first circuit branch (C1) connected between the input terminal (TRa) and an output terminal of the tube amplifier and a second circuit branch (C2) connected to the input terminal (TRa) of the output transformer (TR) and in parallel to the first circuit branch and including components that produce an electric current proportional to a current level in the first circuit branch. The first and second circuit branches are located between the tube amplifier and the output transformer (TR) and include semiconductor devices so that the output signal from the tube amplifier is amplified while maintaining the output properties of the tube amplifier.

10 Claims, 10 Drawing Sheets

OUTPUT SIGNAL CONVERTER FOR AMPLICIATION OR ATTENUATION OF TUBE AMPLIFIER OUTPUT WHILE MAINTAINING OUTPUT PROPERTIES

This is a divisional of Ser. No. 09/200,102, filed on Nov. 24, 1998, now U.S. Pat. No. 6,175,271.

BACKGROUND OF THE INVENTION

1. Field of the Invention

The present invention is related to an amplifier for electronic musical instruments and audio systems, and more particularly to an output signal converter for tube amplifiers which is installed on the rear side of a tube amplifier and capable of amplifying or attenuating output signals while maintaining advantageous output properties of tube amplifiers.

2. Prior Art

Because of progress in the field of semiconductor technology, vacuum tube amplifiers for electronic musical instruments and audio systems have been replaced by amplifiers based on semiconductor devices, such as transistors. However, tube amplifiers have particular output properties which cannot be reproduced exactly by amplifiers using only semiconductor devices and thus have persistent popularity so that a small number of tube amplifiers are still being produced, sold and used.

The disadvantages of vacuum tubes are well known. They have comparatively short lives, are broken more easily, are less reliable, bigger and more inconvenient to install than corresponding semiconductor devices. They are comparatively heavy, produce more heat and more expensive than similar semiconductor devices. In many cases amplifiers based on semiconductor devices must be used because the corresponding vacuum tube amplifier is not available.

Many types of amplifiers which mimic to some extent the output properties of tube amplifiers by using semiconductor devices have been devised and used in practice.

However, one output property that can be obtained by using tube amplifiers is the one obtainable when magnetic saturation in an output transformer installed on the backside of a tube amplifier and counter electromotive force generated in a speaker affect the performance of a tube amplifier. Therefore, in the prior art there is a limit to the ability of semiconductor devices to reproduce the output properties of tube amplifiers. In fact, no amplifiers which can accurately imitate the output properties of tube amplifiers are known in the prior art.

SUMMARY OF THE INVENTION

It is an object of the present invention to provide an output signal converter for tube amplifiers from which output signals of a predetermined power level can be obtained from those of a tube amplifier containing a minimum number of vacuum tubes by converting the output signals of the tube amplifier by means of semiconductor devices while maintaining tube amplifier output properties including transformer and speaker properties obtainable when using tube amplifiers.

According to a preferred embodiment of the invention an output signal converter for a tube amplifier comprises semiconductor devices for amplifying or attenuating an output signal of the tube amplifier while maintaining output properties of the tube amplifier. The output signal converter comprises an output transformer having an input terminal; a first circuit branch connected between the input terminal and an output terminal of the tube amplifier and a second circuit branch connected to the input terminal of the output transformer and also connected in parallel to the first circuit branch. The second circuit branch includes means for generating an electric current proportional to a current level in the first circuit branch. The first circuit branch and the second circuit branch are located between the tube amplifier and the output transformer and comprise semiconductor devices so that the output signal from the tube amplifier is amplified while maintaining the output properties of the tube amplifier.

In a particularly preferred embodiment of the output signal converter the first circuit branch consists of a first resistance and a first transistor connected in series with each other, the second circuit branch consists of a second resistance and a second transistor connected in series with each other, the first transistor has a base terminal connected to a node between the second resistance and the second transistor and the second transistor has a base terminal connected to a node between the first transistor and the output terminal of the tube amplifier.

In another embodiment similar to the above-described embodiments a third transistor is connected in series between the second resistance and the second transistor and also connected to the base terminal of the first transistor to form a mirror circuit portion together with the first transistor.

In an additional embodiment similar to the above-described embodiments a diode is connected between the second resistance and the second transistor.

Preferably the second resistance is a variable resistance.

According to another preferred embodiment the output signal converter for a tube amplifier comprises semiconductor devices for amplifying or attenuating an output signal of the tube amplifier while maintaining output properties of the tube amplifier, while the tube amplifier comprises a first vacuum tube and a second vacuum tube. The output signal converter comprises an output transformer having a first input terminal and a second input terminal; a first circuit branch connected between the first input terminal and an output terminal of the first vacuum tube; a second circuit branch connected to the first input terminal of the output transformer and in parallel to the first circuit branch and including means for generating an electric current proportional to a current level in the first circuit branch; a third circuit branch connected between the second input terminal of the output transformer and an output terminal of the second vacuum tube; a fourth circuit branch connected to the second input terminal of the output transformer and in parallel to the third circuit branch and including means for generating an electric current proportional to the current level flowing in the first circuit branch; wherein the first circuit branch, the second circuit branch, the third circuit branch and the fourth circuit branch are located between the tube amplifier and the output transformer and comprise semiconductor devices so that the output signal from the tube amplifier is amplified while maintaining the output properties of the tube amplifier.

In a particularly preferred embodiment the first circuit branch consists of a first resistance and a first transistor connected in series with each other, the second circuit branch consists of a second resistance and a second transistor connected in series with each other, the third circuit branch consists of a third resistance and a third transistor connected in series with each other, the fourth circuit branch consists of a fourth resistance and a fourth transistor connected in series with each other, the first transistor has a base terminal connected to a node between the second resistance and the second transistor, the second transistor has a base terminal connected to a node between the first transistor and the output terminal of the first vacuum tube, the third transistor has a base terminal connected to a node between the fourth transistor and the fourth resistance and the fourth transistor has a base terminal connected to a node between the third transistor and the output terminal of the second vacuum tube.

In another embodiment similar to the embodiment described immediately above a fifth transistor is connected between the second resistance and the second transistor and is also connected to the first transistor to form a current mirror circuit portion and a sixth transistor is connected between the fourth resistance and the fourth transistor and is also connected to the third transistor to form another current mirror circuit portion.

In addition embodiment similar to the above-described embodiments a first diode is connected between the second resistance and the second transistor and a second diode is connected between the fourth resistance and the fourth transistor.

Preferably the second resistance and the fourth resistance are each variable.

The above-described embodiments of the output signal converter for a tube amplifier comprise semiconductor devices that amplify or attenuate the output of a tube amplifier containing a minimum number, preferably one, vacuum tube while maintaining tube amplifier output characteristics. In this way the disadvantages of a tube amplifier containing a large number of vacuum tubes, that have comparative short lifetimes, are easily broken and inconvenient to install are avoided, while still maintaining the desirable output characteristics of a vacuum tube amplifier.

BRIEF DESCRIPTION OF THE DRAWINGS

The objects, features and advantages of the invention will now be illustrated in more detail with the aid of the following description of the preferred embodiments, with reference to the following accompanying figures.

FIGS. 4A, 4B, 4C and 4D are respective graphical illustrations showing output properties obtained when using the output signal converter according to the present invention, wherein

FIGS. 6A, 6B and 6C are respective graphical illustrations showing output properties obtained when using the circuit shown in FIG. 5, wherein

DETAILED DESCRIPTION OF THE PREFERRED EMBODIMENTS

Figure 1:
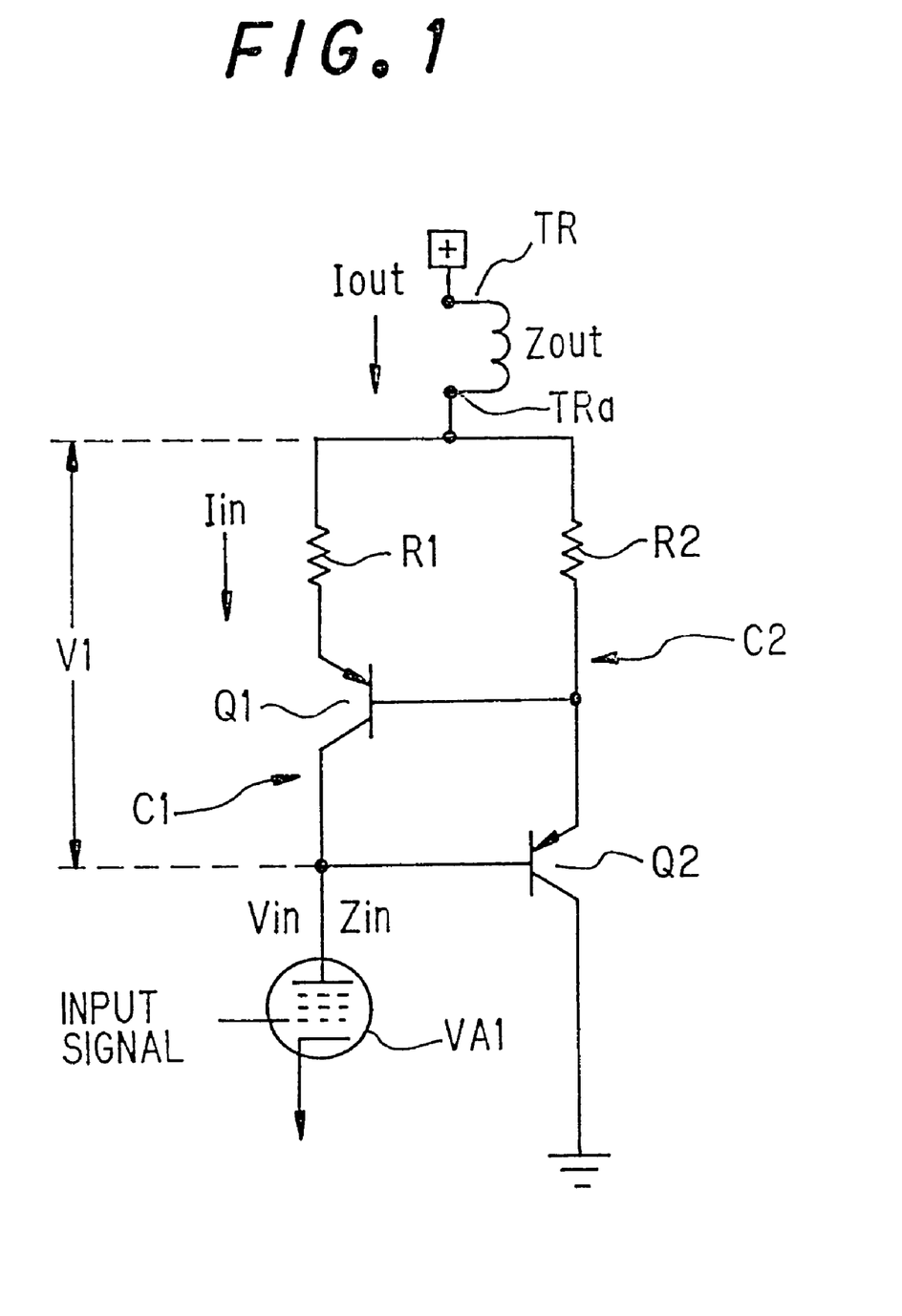
FIG. 1 is a circuit diagram showing an output signal converter for tube amplifiers according to the first embodiment of the present invention.

FIG. 1 is a circuit diagram showing an output signal converter for tube amplifiers according to the first embodiment of the present invention. With this output signal converter, it is possible to amplify output signals obtained from one vacuum tube VA1 while maintaining its output properties and thus obtaining output signals as if they are the ones having been obtained by using a plurality of vacuum tubes.

As shown in FIG. 1, the output signal converter is provided on a site between a plate terminal of a vacuum tube VA1 and one of the input terminals TRa of an output transformer TR and comprises a first circuit branch C1 which is formed by connecting a first resistance R1 and a first transistor Q1 connected in series and a second circuit branch C2 which is formed by connecting a second resistance R2 and a second transistor Q2 in series.

Namely, the terminal TRa is branched into two systems, and one of the systems (the first circuit branch C1) is connected to an emitter of the first transistor Q1 via the first resistance R1, and a collector of the transistor Q1 is connected to the plate terminal of the vacuum tube VA1. The other system (the second circuit branch C2) is connected to an emitter of the second transistor Q2 via the second resistance R2, and a collector of the second transistor Q2 is connected to ground. Further, a base of the first transistor Q1 is connected to the emitter of the second transistor Q2, and a base of the second transistor Q2 is connected to the plate terminal of the vacuum tube VA1.

Now, detailed performance of the output signal converter as constituted above is explained below. Current flowing into the primary side of the transformer TR is defined as Iout, current flowing into the first circuit branch C1 is defined as Iin, voltage between the plate terminal of the vacuum tube VA1 and the input terminal TRa of the transformer TR is defined as V1, an impedance of the load side at the transformer TR is defined as Zout, and an impedance of the load side at the vacuum tube VA1 is defined as Zin. The following equations (1) to (3) can be given:

$$I_{out}=V_{in}/(Z_{out}+R1//R2) \quad (1),$$

wherein R1//R2 represents the parallel resistance of the resistance R1 and the resistance R2 connected in parallel (R1*R2/R1+R2).

$$V1=R1//R2*I_{out} \quad (2)$$

$$I_{in}=V1/R1 \quad (3)$$

Equation (4) is obtained from equations (2) and (3):

$$I_{in}=[(R1//R2)/R1]*I_{out} \quad (4)$$

Further, an equation, Iin=Vin/Zin, is substituted into an equation (4), and an equation (1) is also substituted into the equation (4), thereby the following equation (5) can be given:

$$V_{in}/Z_{in}=[(R1//R2)/R1]*V_{in}/[Z_{out}+(R1//R2)] \quad (5)$$

By rearranging the equation (5) and developing R1//R2 the following equation (6) can be given:

$$Z_{in}=[(R1+R2)/R2]*[Z_{out}+\{(R1*R2)/(R1+R2)\}] \quad (6)$$

In the equation (6), under conditions such that R1<<Zout and R2<<Zout, the following equation (7) can be given:

$$Z_{in}\approx[(R1+R2)/R2]*Z_{out} \quad (7)$$

From the equation (7), it will be understood that Zin and Zout are determined according to a ratio of the first resistance R1 and the second resistance R2. For example, when R1=R2 is given, an equation, Zout=(½)Zin results, and the impedance comes to ½. Therefore, the current output of the transformer TR is a double value, which shows that output signals produced by the vacuum tube VA1 can be amplified to a double level of the current output. In addition, current flowing into the second circuit branch C2, which is a circuit branch formed with the second resistance R2 and the second transistor Q2, comes to an equivalent value as the current flowing into the first circuit branch C1 so that Iout comes to a double value of Iin which apparently maintains the output properties of the vacuum tube VA1. As a result, output signals having properties that are characteristic of two vacuum tubes, instead of only one vacuum tube, are obtained.

Also, by appropriately changing a ratio of the first resistance R1 and the second resistance R2, it is possible to change current amplification factor. For example, if R2=2*R1 is given, it is possible to triple the value of Iout relative to the value of Iin, and if R2=(½)* R1 is given, it is possible to make a value of Iout to a 1.5 times value of Iin.

As described above, according to the output signal converter shown in FIG. 1, it is possible to obtain output signals having properties characteristic of more than 1 vacuum tube, by using just one vacuum tube VA1, and therefore, it becomes feasible to reduce the number of vacuum tubes to be provided to a minimum number. It is very advantageous to use the output signal converter according to the present invention for amplifiers in use for guitars and audio systems.

Although a resistance R2 of fixed value is used in the converter of FIG. 1, when a variable resistance R2 is given, it is possible to adjust the current value of Iout by controlling the resistance value of the variable resistance to thereby allow control of output sound volume. Although sound volume control is normally operated at the input side, namely at the stage prior to the vacuum tube VA1 in FIG. 1, it is possible to adjust the sound volume while keeping the current Iin flowing in the vacuum tube VA1 at a substantially fixed level by adopting a method to control resistance value of the second resistance R2, which allows control of the sound volume while maintaining the output properties of vacuum tubes.

Figure 2:
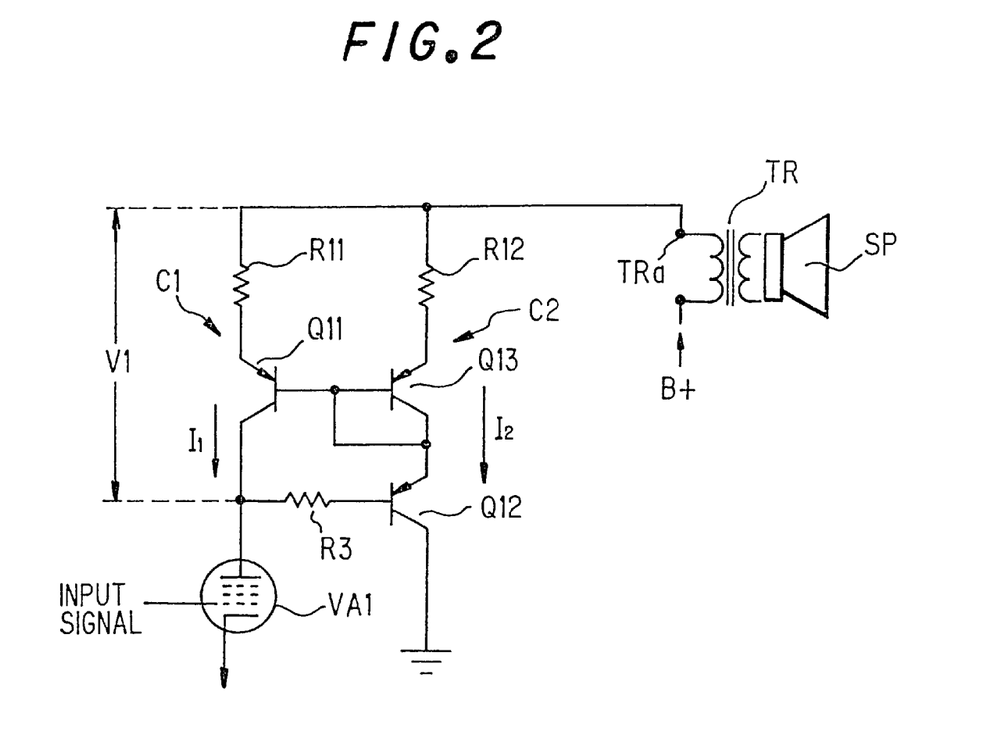
FIG. 2 is a circuit diagram showing the output signal converter for tube amplifiers according to the second embodiment of the present invention.

FIG. 2 is a circuit diagram showing the output signal converter for tube amplifiers according to the second embodiment of the present invention. As shown in FIG. 2, the output signal converter comprises an output transformer TR, resistances R11, R2 and R3, and transistors Q11, Q12 and Q13. A connecting cable connected to one of input terminals of the output transformer TR is branched into two systems, and one of the branches (a first circuit branch C1) is connected to a plate terminal of a vacuum tube VA1 via the first resistance R11 and, an emitter and a collector of the first transistor Q11, while the other branch (a second circuit branch C2) is connected to ground via the second resistance R12, an emitter and a collector of the third transistor Q13, and further an emitter and a collector of the second transistor Q12. Further, a base of the first transistor Q11 and a base of the third transistor Q13 are connected, and this node is further connected to a collector of the second transistor Q12. Therefore, a current mirror circuit is formed with the first transistor Q11 and the third transistor Q13. Whereas, a base of the second transistor Q12 is connected to the plate terminal of the vacuum tube VA1 via the resistance R3, and a speaker SP is connected to the output side of the output transformer TR.

In the embodiment shown in FIG. 2, because of formation of the current mirror circuit formed with the first transistor Q11 and the third transistor Q13, current directly imitating the property of the first transistor Q11, such as temperature characteristic, flow into the second circuit, and therefore, it is possible to obtain output signals having the output properties of the vacuum tube VA1.

Figure 3:
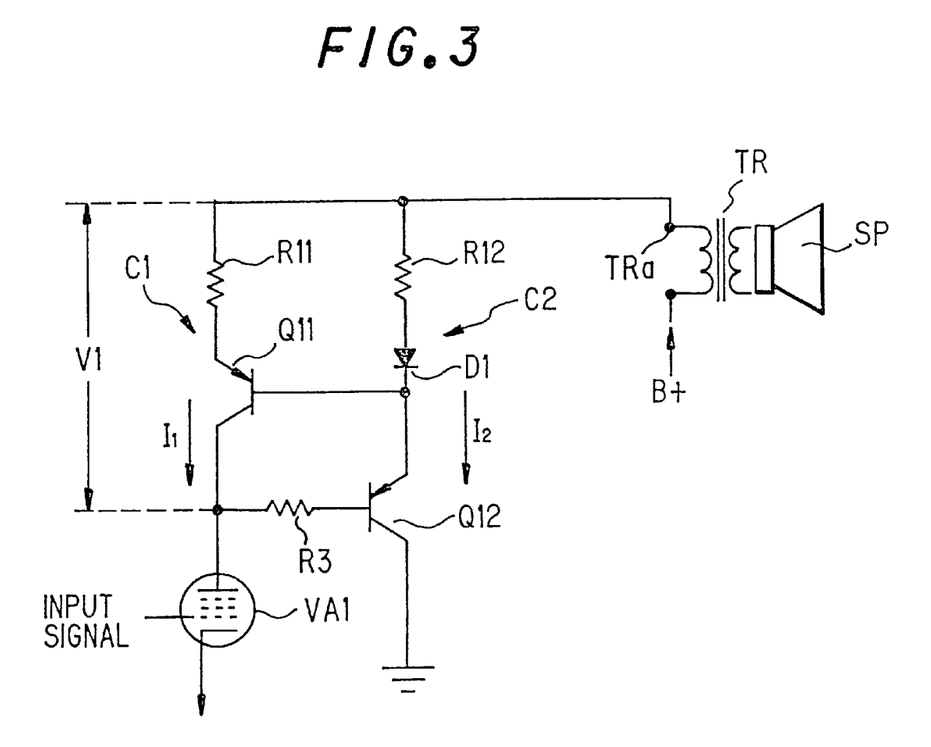
FIG. 3 is a circuit diagram showing the output signal converter for tube amplifiers according to the third embodiment of the present invention.

FIG. 3 is a circuit diagram showing the output signal converter according to third embodiment of the present invention. As shown in FIG. 3, a diode D1 is used as the substitute for the third transistor Q13 in the output signal circuit shown in FIG. 2. According to this type of constitution, although performance stability gets worse in comparison with that in the output signal converting circuit as shown in FIG. 2, simplification of a circuit is allowable up to an extent that is obtainable by using a diode as a substitute of a transistor.

Figures 4A, 4B, 4C, 4D:
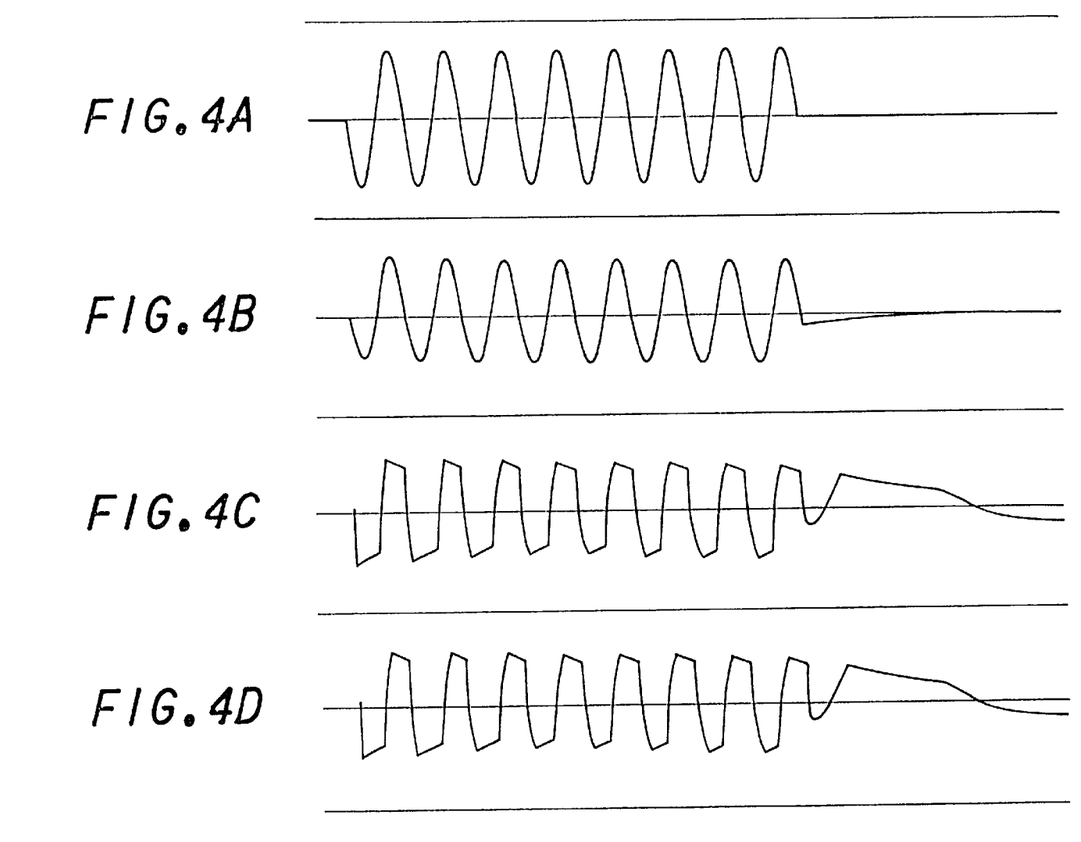
FIG. 4A shows a sine wave to be input to the output signal converter.
FIG. 4B shows a wave form of an output signal when the sine wave signal is input into an amplifier containing only semiconductor devices.
FIG. 4C shows a wave form of an output signal when the sine wave is input into a tube amplifier.
FIG. 4D shows a wave form of an output signal when the sine wave is input into the converter circuit shown in FIG. 2.

FIG. 4 is an explanatory diagram showing different wave forms, wherein FIG. 4A shows a wave form of a sine wave as an input signal, FIG. 4B shows an output wave form when amplified the sine wave signal shown in FIG. 4A by using an amplifier constituted with semiconductor devices, FIG. 4C shows an output wave form when amplified the sine wave shown in FIG. 4A by using a conventional tube amplifier (an amplifier constituted with a plurality of vacuum tubes), and FIG. 4D shows an output wave form when amplified the sine wave signal shown in FIG. 4A by using the output signal converting circuit shown in FIG. 2. As easily understood from FIG. 4B, contrary to that the output wave form which substantially-truly presents the sine wave to be input is obtainable by using the amplifier containing semiconductor devices, the output wave form specifically produced by the tube amplifier is obtainable when using the conventional tube amplifier as shown in FIG. 4C.

When amplifying the sine wave shown in FIG. 4A by using the output signal converter shown in FIG. 2, it is possible to obtain output signals which are substantially equivalent to the output wave form obtainable by using a conventional tube amplifier as shown in FIG. 4D, thus it will be understood that the output signal converter of the present invention is truly reproducing the output property given by a vacuum tube.

Figure 5:
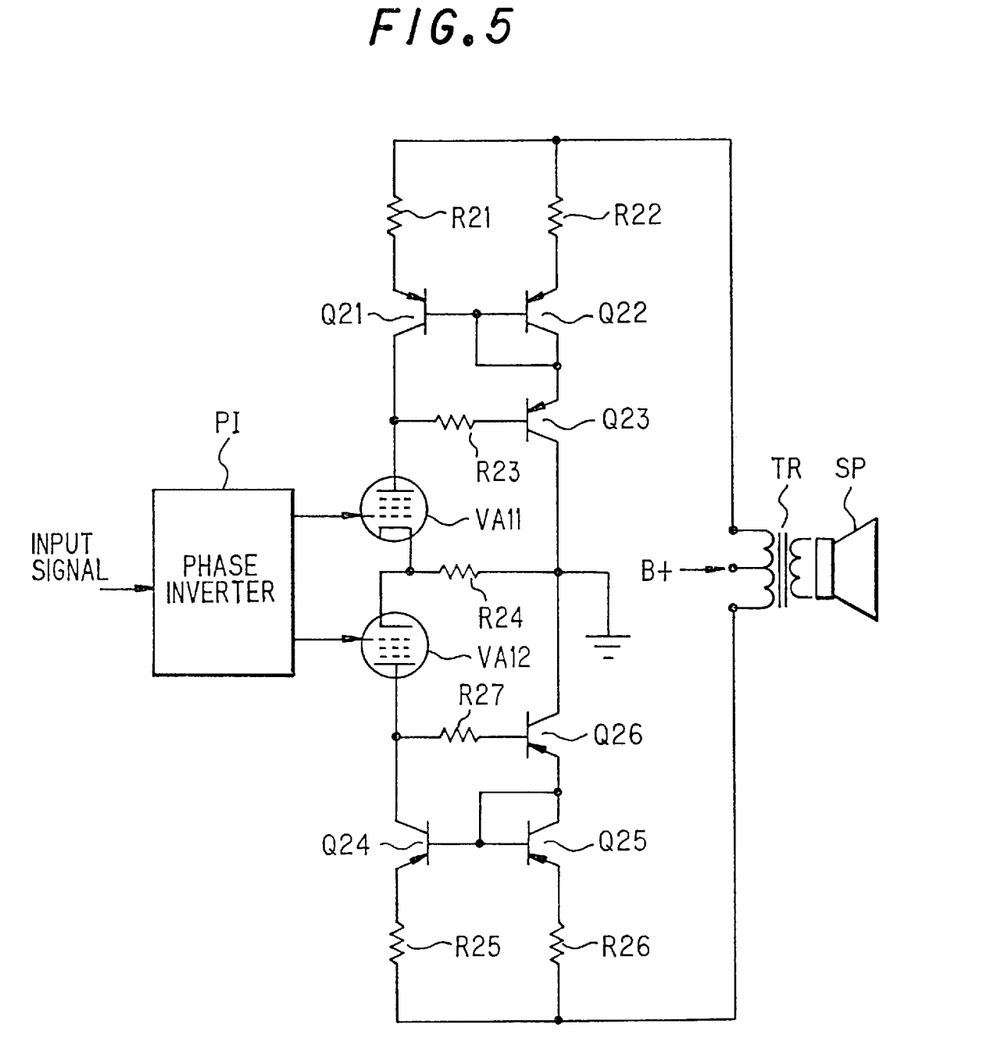
FIG. 5 is a circuit diagram showing the output signal converter for tube amplifiers according to the fourth embodiment of the present invention, and it is designed for a push-pull amplifier.

FIG. 5 is a circuit diagram showing the constitution of the output signal converter according to the forth embodiment. As shown in FIG. 5, a push-pull amplifier is constituted with two vacuum tubes VA11 and VA12 in the output signal converter. In briefly, two circuits each using a current mirror shown in FIG. 2 are provided symmetrically at both upper and lower sites, each cathodes of the two vacuum tubes VA11 and VA12 are connected and a node thereof is connected to the ground via resistance R24.

As it is well known, push-pull type power amplification is an output system which separates sound signals produced by a preamplifier into positive and n negative signals by using a phase inverter PI, amplifying the positive side signals at an upper circuit (i.e. a circuit containing Q21, Q22, Q23, etc.) provided with the vacuum tube VA11, amplifying the negative side signals at a lower circuit (i.e. a circuit containing Q24, Q25, Q26, etc.) provided with vacuum tube VA12, and composing such signals at the output transformer TR and outputting them through the speaker SP. With the constitution as described above, as two vacuum tubes VA11 and VA12 are used therein, it is possible to obtain output property equivalent to the one obtainable by a push-pull type tube amplifier containing many vacuum tubes.

Figure 6A:
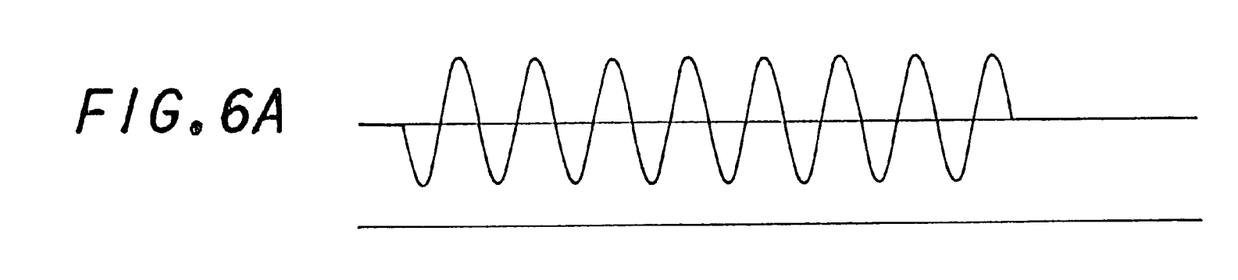
FIG. 6A shows a sine wave to be input.
Figure 6B:
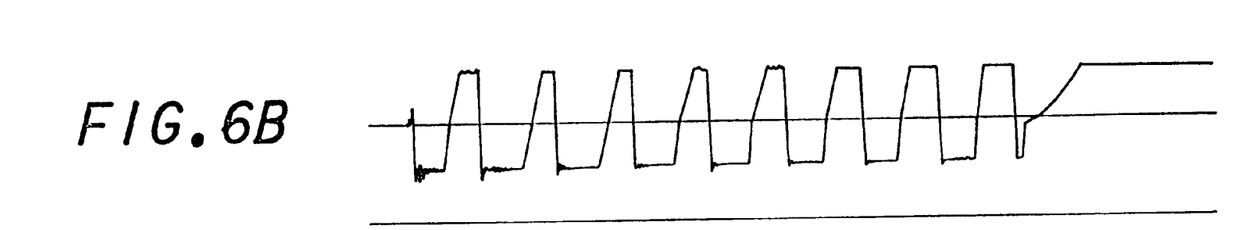
FIG. 6B shows a wave form of an output signal when the sine wave is input into a push-pull amplifier containing four vacuum tubes.
Figure 6C:
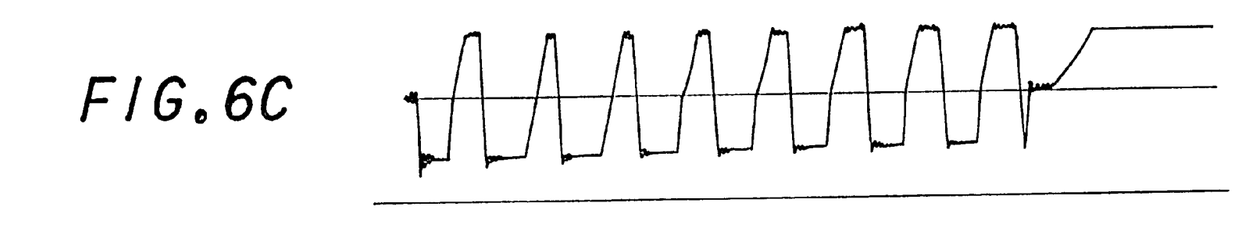
FIG. 6C shows a wave form of an output signal when the sine wave is input into the circuit shown in FIG. 5.

FIG. 6 shows a wave form showing the output property of the push-pull type amplifier shown in FIG. 5, wherein FIG. 6A shows a sine wave as an input signal, FIG. 6B shows an output wave form when applying the sine wave shown in FIG. 6A into an amplifier constituted with four vacuum tubes, namely a conventional push-pull type tube amplifier, and FIG. 6C shows an output wave form when applying the sine wave shown in FIG. 6A into the amplifier shown in FIG. 5. As easily understood from FIGS. 6B and 6C, it is confirmable that the output signal converter shown in FIG. 5 can truly reproduce the output property produced by a vacuum tube, because it is demonstrated that substantially-equivalent wave forms are obtainable from the comparison of the wave forms obtainable by using a conventional push-pull type amplifier containing many vacuum tubes with the ones obtainable by using an amplifier containing a minimum number of vacuum tubes.

Figure 7:
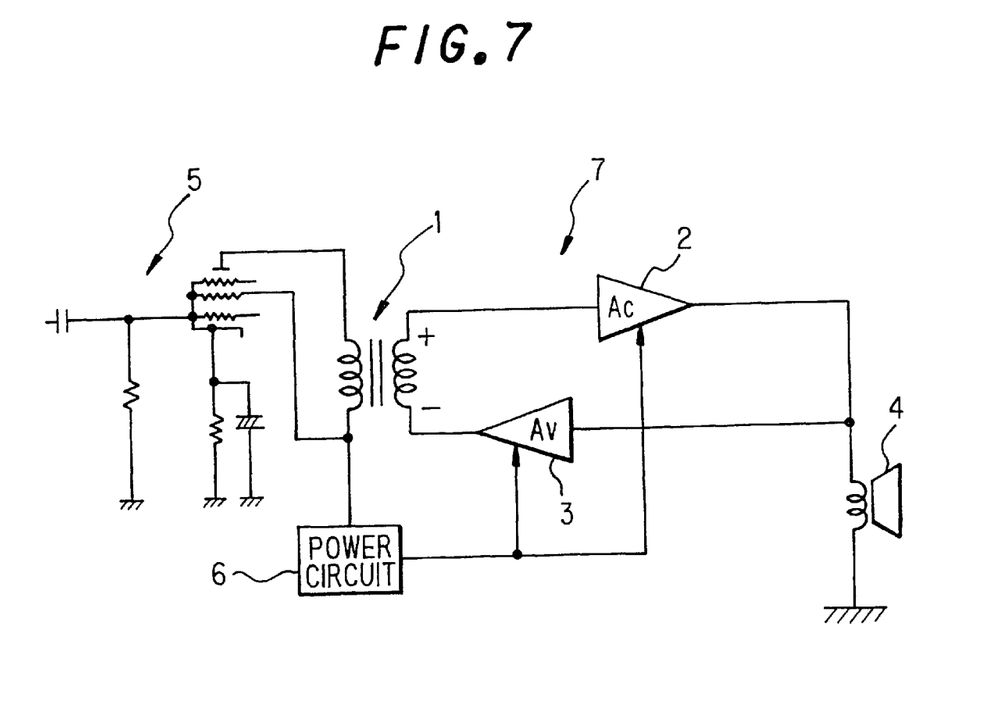
FIG. 7 is a circuit diagram showing the output signal converter for tube amplifiers according to the fifth embodiment of the present invention.

FIG. 7 is a circuit diagram showing the constitution of the output signal converter according to the fifth embodiment. As shown in FIG. 7, an output signal converter 7 is installed at the output side of a tube amplifier 5 containing just one vacuum tube and amplify and/or reduce output signals with keeping the output property of the tube amplifier 5.

The output signal converter 7 is constituted with a transformer 1 provided at the output side of the tube amplifier 5, a current amplifier 2 connected to a positive terminal at secondary side of the transformer 1, and a voltage amplifier 3 connected to the output side of the current amplifier 2 and of which output terminal being connected to a negative terminal at secondary side of the transformer 1. Further, a power circuit 6 is provided as an electric power supply for driving the tube amplifier 5 and the output signal converter 7. A speaker 4, connected to the rear side of the output signal converter 7, one of which terminals is connected to a node of the current amplifier 2 and the voltage amplifier 3, while the other terminal is connected to the ground.

And, in the output signal converter shown in FIG. 7, there is a correlation provided for current amplification rate Ac of the current amplifier 2 and voltage amplification rate Av of the voltage amplifier 3 represented by an equation, $Ac*Av=-1$. Therefore, an impedance of the load side viewed from the tube amplifier 5 becomes equivalent to an impedance of the load side (i.e. the side of the speaker 4) viewed from the output signal converter 7, as if the tube amplifier 5 is directly connected to the speaker 4.

Consequently, the output signal converter 7 can amplify or reduce the level of the output signals to a desired level with maintaining the output property of the tube amplifier 5. Namely, as output power value is proportional to a squared value of current amplification rate Ac at the current amplifier 2, if conditions, $Ac=-3.16$ and $Av=0.316$ are given, the output power value comes to a squared value of $-3.16$, that is 10, and therefore, ten times power can be given in this case. Or, contrary to this, when taking the value of current amplification rate closer to zero, it possible to reduce the maximum output with maintaining the output property of the tube amplifier 5. A purpose to reduce the maximum output will be explained later in this specification.

Although the equation, $Ac*Av=-1$, is given in the explanation described above because the number of the speaker 4 provided is just one, it is also possible to provide an equation, $Ac*Av=-1$ when two speakers 4 are connected in series, or an equation, $Ac*Av=-½$, when two speakers 4 are connected in parallel. Therefore, when describing in general, an equation, $Ac*Av=-k$ (k is a constant) can be given.

Figure 8:
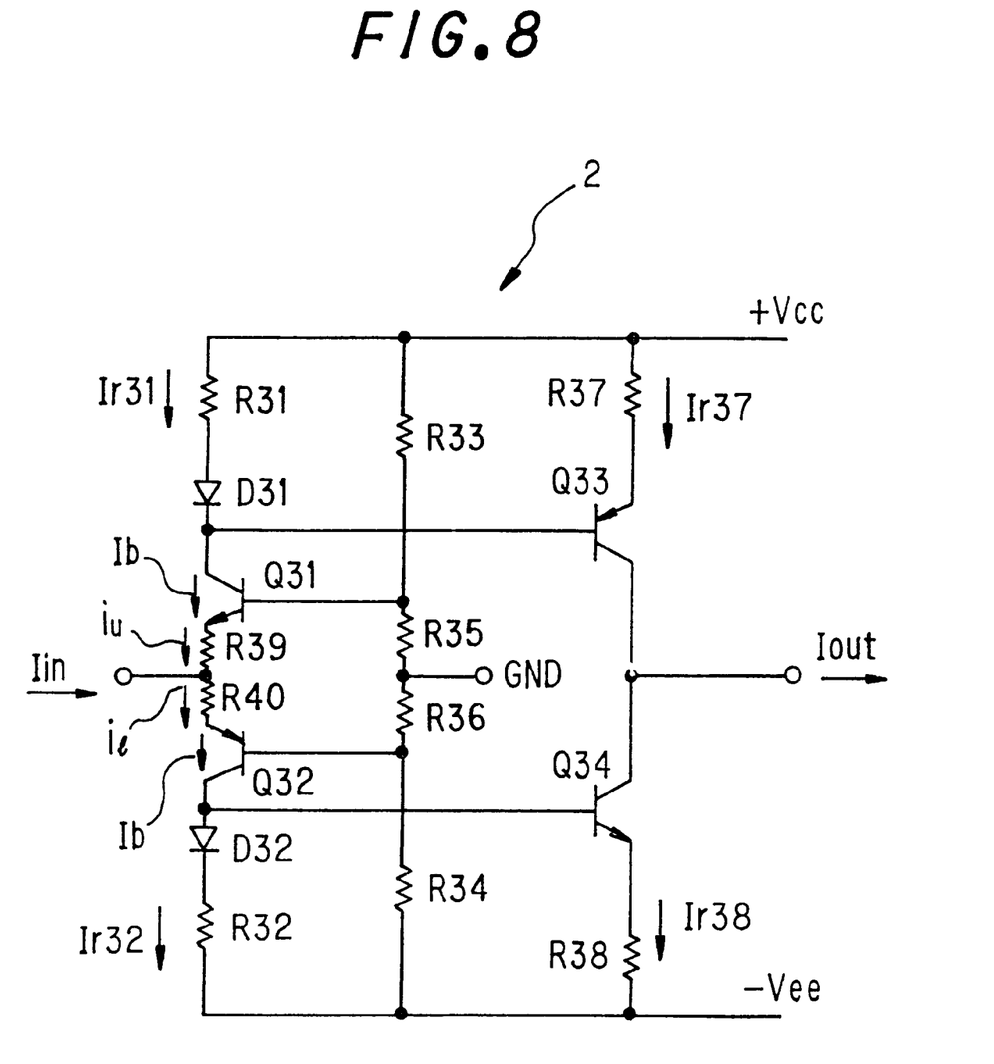
FIG. 8 is a circuit diagram showing a particular embodiment of a current amplifier for the output signal converter according to the invention.

FIG. 8 is a circuit diagram showing a concrete constitution of the current amplifier 2 shown in FIG. 7. As shown in FIG. 8, the current amplifier 2 is constituted with four transistors Q31–Q34, a diode, a resistance, etc. and is arranged on a site between a power source +Vcc and a power source −Vee.

At the current input side, an emitter of the transistor Q31 (NPN-type) and an emitter of the transistor Q32 (PNP-type) are connected via resistances R39 and R40, and a collector of the transistor 031 is connected to the power source +Vcc via a diode D31 and a resistance R31. Also, a collector of the transistor Q32 is connected to the power source −Vee via a diode D32 and a resistance R32. Whereas, between the power source +Vcc and the power source −Vee, a connecting circuit which connects resistances R33, R35, R36 and R34 in series is connected, and a node of the resistances R33 and R35 is connected to a base of the transistor Q3!, while a node of the resistances R36 and R34 is connected to a base of the transistor Q32. Further, a collector of the transistor Q31 is connected to a base of transistor Q33 (PNP-type), and similarly, a collector of the transistor Q32 is connected to a base of the transistor Q34 (NPN-type). And, a collector,of the transistor Q33 and a collector of the transistor Q34 are connected, and an emitter of the transistor Q33 is connected to the power source +Vcc via a resistance R37, while an emitter of the transistor Q34 is connected to the power source −Vee via a resistance R38.

And, it is designed to supply input current Iin to a node of resistances R39 and R40 which is arranged on sites between each emitters of the transistors Q31 and Q32. Whereas, a node of the resistance R35 and R36 is connected to the ground, and a node of a collector of the transistor Q33 and a collector of the transistor Q34 is designed as an output point of output current Iout.

Figure 9:
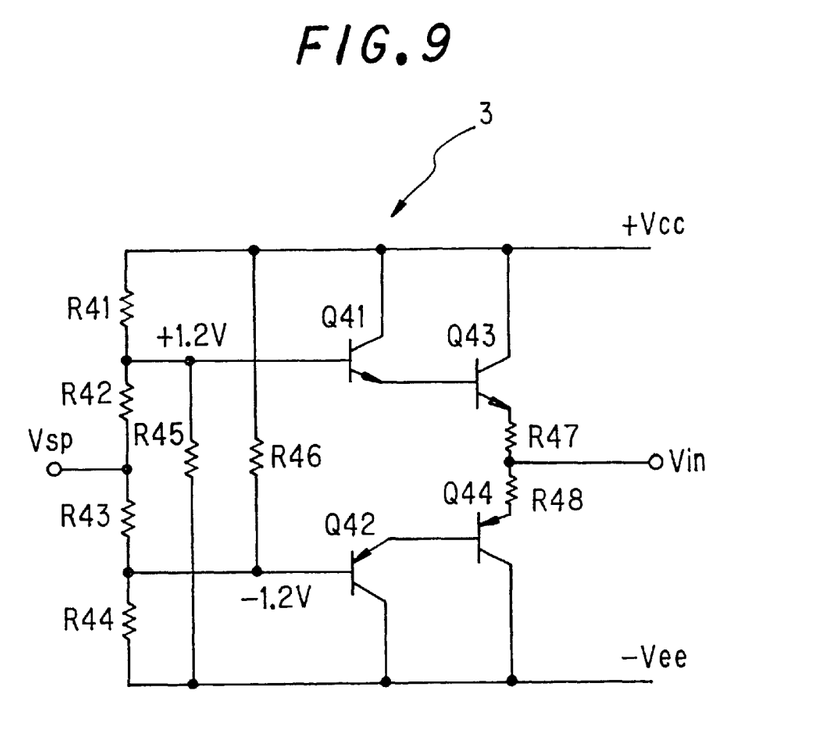
FIG. 9 is a circuit diagram showing the a particular embodiment of a voltage amplifier for the output signal converter according to the invention.

FIG. 9 is a circuit diagram showing a concrete constitution of the voltage amplifier 3. As shown in FIG. 9, the voltage amplifier 3 is constituted with four transistors Q41–Q44 and a plurality of resistances and is connected to a site between the power sources +Vcc and −Vee to be actuated. Between the power sources +Vcc and −Vee, a connecting circuit connecting resistances R41, R42, R43 and R44 in series is arranged, wherein a node of the resistance R41 and the resistance R42 is branched to two systems, one of the branches is connected to a base of the transistor Q41 (NPN-type), while the other branch is connected to the power source −Vee via a resistance R45. Similarly, a node of the resistance R43 and the resistance R44 is branched into two systems, and one of the branches is connected to a base of the transistor Q42 (PNP-type), while the other is connected to the power source +Vcc via a resistance R46.

Further, a collector of the transistor Q41 is connected to the power source −Vcc, and an emitter is 10 connected to a base of the transistor Q43 (NPN-type). Similarly, a collector of the transistor Q42 is connected to the power source −Vee, and an emitter is connected to a base of the transistor Q44 (PNP-type). In addition, a collector of the transistor Q43 is connected to the power source +Vcc, a collector of the transistor Q44 is connected to the power source −Vee, and each emitters of the transistors Q43 and Q44 are connected via microresistances R47 and R48. Further, a node of the resistance R42 and the resistance R43 is provided as an input point for voltage, that is a terminal voltage Vsp of the speaker 4 shown in FIG. 7, and a node of the resistance R47 and the resistance R48 is provided as an output point for voltage, that is −Vin.

Now, performance of the output signal converting circuits shown in FIGS. 7–9 are described in detail. In the current amplifier 2 shown in FIG. 8, the two resistances R34 and R36 are arranged on sites between the power source −Vee and GND, and therefore, a voltage impressed to the base of the transistor Q32 comes to a value of [R34/(R34+R36)]* (−Vee). Due to impression of this voltage into the base of the transistor Q32, bias current Ib is flown to a site between the collector and the emitter of the transistor Q32, and input electric potential becomes to almost 0 V and this voltage is maintained irrespective of the start of input current flow. When voltage drop in the diode D31 and voltage drop between the base and the emitter of the transistor Q34 is same, voltage impressed to the resistances and R38 are same too, so that a current Ir32 flowing into the resistance R32 and a current Ir38 into the resistance R38 can be calculated according to the following equation:

$$Ir38=-Ir32*R32/R38.$$

Similarly, if Ir37=−Ir31*R31/R37, R31=R32, R37=R38, and k=R32/R38 are given, Ir38=−Ir32*k, and Ir37=−Ir31*k are obtained. If input current I in is replaced by il-iu, wherein iu is current flows in direction to the resistance R39 and is current flowing in direction to the resistance R40, the following correlations are given:

$$Ir32=il+Ib,\ Ir31=iu+Ib$$

$$Iout=Ir37-Ir38=-k*Iin=(R32/R38)*Iin$$

Then, an equation, $$Iout=-(R32/R38)Iin \qquad (8)$$

is obtained, and from which it will be understood that input current has been amplified. Here, as examples for the constitutions of the circuits shown in FIG. 8, the following assumption can be made:

R31, R32=5Ω
P33, R34=150Ω
R35, R36=5Ω
R37, R38=2.5Ω
R39, R40=0.5Ω
+Vcc=+20 V
−Vee=−20 V

According to the condition described above, R32/R38=2 is given, so it will be understandable that current amplification rate is a double value. The resistances R39 and R40 and the two diodes D31 and D32 are factors to be used for stabilizing the performance of the circuits.

Now, explanation is made with regard to the performance of the voltage amplifier 3 shown in FIG. 9. In this figure, an input voltage in voltage amplifier 3 is a voltage Vsp to be impressed into the speaker 4 (see FIG. 7), and an output voltage is Vin. As shown in FIG. 9, a series connecting circuit containing the resistances R41 and R45 is arranged on a site between the positive power source +Vcc and negative power source −Vee so that a voltage at the node of the resistance R41 and R45 comes to a value being separated based on the value of such resistances. Now, as concrete resistance values, the followings are provided:

R41, R44=189Ω
R42, R43=100Ω
R45, R46=213Ω
+Vcc=+20 V
−Vee=−20 V

Then, a voltage at the node of the resistances R41 and R45 comes +1.2 V, and this voltage is to be impressed into the base of the transistor Q41. Further, taking into consideration a fact that parallel resistance of the resistances R41 and R45 comes approximately 100Ω and the resistance R42 is 100Ω, a signal of which input voltage Vsp being reduced to a ½ value is given to the node of the resistances R41 and R45, that is the base of the transistor Q41. Since the transistors Q41 and Q43 each independently perform as an emitter follower, a signal given to the base of transistor Q41 is to be output as an output voltage Vin. Namely, output voltage Vin becomes ½ value of input voltage VSP, and it will be understood that voltage amplification rate is ½. With regard to the circuit shown on the lower part of the drawing which is constituted with the transistors Q42, Q44, etc., since there is difference in the circuit from the one shown on the upper part only in their polarity, and since it performs in the same manner as described above, no explanation on the circuit shall be made.

As described above, it is allowable to constitute the current amplifier 2 having a current amplification rate Ac of 2 and the voltage amplifier 3 having a voltage amplification rate of ½, and since output voltage power supply produced by an output signal converting circuit equipped with such current amplifier 2 and such voltage amplifier 3 can be either amplified or reduced proportionally to a squared value of the current amplification rate Ac, the output power can be four times increased. Whereas, output power can be reduced if setting the current amplification rate Ac to a value less than 1, and it gets the value closer to zero. And, if the current amplifier 2 and the voltage amplifier 3 are connected with each other as shown in FIG. 7, a correlation of Ac*Av=−1 can be obtained so that the impedance of the load side viewed from the tube amplifier 5 gets equal to the impedance in case of directly connecting the speaker 4 to the tube amplifier 5, while the impedance of the power side viewed from the speaker 4 gets equal to the impedance in case of directly installing the tube amplifier 5 to the speaker 4. Consequently, output property obtained from the tube amplifier 5 is directly amplified by the output signal converter 7 and then supplied to the speaker 4, and therefore, it becomes possible to obtain the output property which is substantially same to the one obtainable by using either high power or low power vacuum tubes.

As described above, in the output signal converter shown in FIG. 7, the output of the tube amplifier 5 constituted by containing less number of vacuum tubes can be amplified by means of using semiconductor devices therein, such as a transistor, with maintaining the output property as obtainable by using tube amplifiers, and it is possible to obtain the output property which is substantially same as the one obtainable by using high power tube amplifiers. In this way, it becomes possible to constitute a high power tube amplifier by using a minimum number of vacuum tubes which have such disadvantages as that it has shorter longevity, produces greater heating value, requires higher voltage power supply, and is more costly, and this type of amplifiers will be extremely advantageous for producing amplifiers in use for electronic guitar and audio system. In addition, there is further advantage in the output signal converter according to the present invention that it can reproduce the output property truly similar to the one obtainable by using the tube amplifiers, contrary to the output property obtainable by using the conventional amplifiers constituted by using semiconductor devices only, which is just imitating the output property of the tube amplifiers.

In the output signal converter according to this embodiment, it is also possible to reduce the power of the tube amplifier 5. Now, an object to reduce output signals as described above is explained. Taking an example for an electronic guitar, it is often intentionally done to distort output sound of the electronic guitar in order to create a feeling of presence and dynamism during a live concert. Therefore, even at the time of practicing prior to the live concert, it is preferable to distort output sound as well as doing so at the live concert. However, it is required to output guitar sound at high sound volume in order to distort the output sound, but it is difficult to do so in a studio for practice due to causing noise that is so troublesome to the neighborhoods. In such a case, since the output signal converter shown in FIG. 7 can reduce the output produced by the tube amplifier 5 and can output the distorted sound at low volume, it is very useful to use the output signal converter under such situation.

Further, in the circuit shown in FIG. 7, an example wherein a power supply for driving the tube amplifier 5 and a power supply for driving the current amplifier 2 and the voltage amplifier 3 are used in the same power circuit 6 is explained, however, it is also possible to constitute a circuit by arranging such power supplies each independently. In this case, the property of the tube amplifier can be either amplified or reduced without causing the change in the property including an effect in power voltage fluctuation accompanying to load fluctuation of a tube amplifier.

Figure 10:
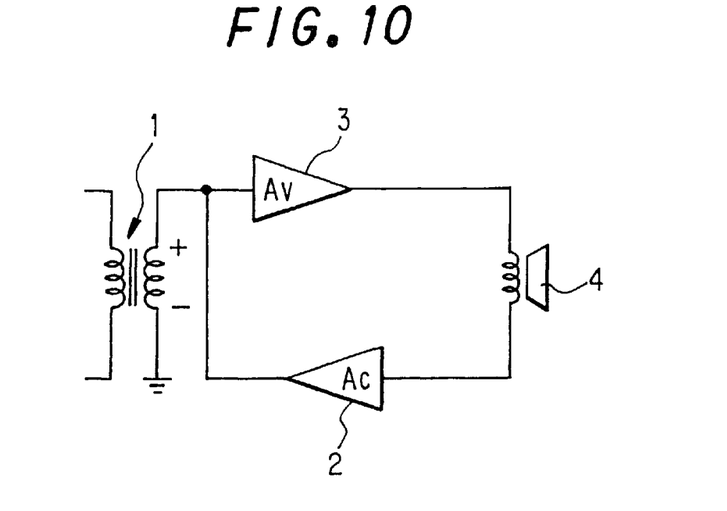
FIG. 10 is a circuit diagram showing a further embodiment of the output signal converter for tube amplifiers shown in FIG. 7.

FIG. 10 is an explanatory diagram showing a modified example for the output signal converter shown in FIG. 7, wherein the speaker 4 is connected in series in between an output terminal of the voltage amplifier 3 and an input terminal of the current amplifier 2, and a node of an output terminal of the current amplifier 2 and an input terminal of the voltage amplifier 3 is connected to one terminal located at the secondary side of the output transformer 1. And, it is also possible to obtain the same performance as the one obtainable by employing the output signal amplifying circuit shown in FIG. 7.

Figure 11:
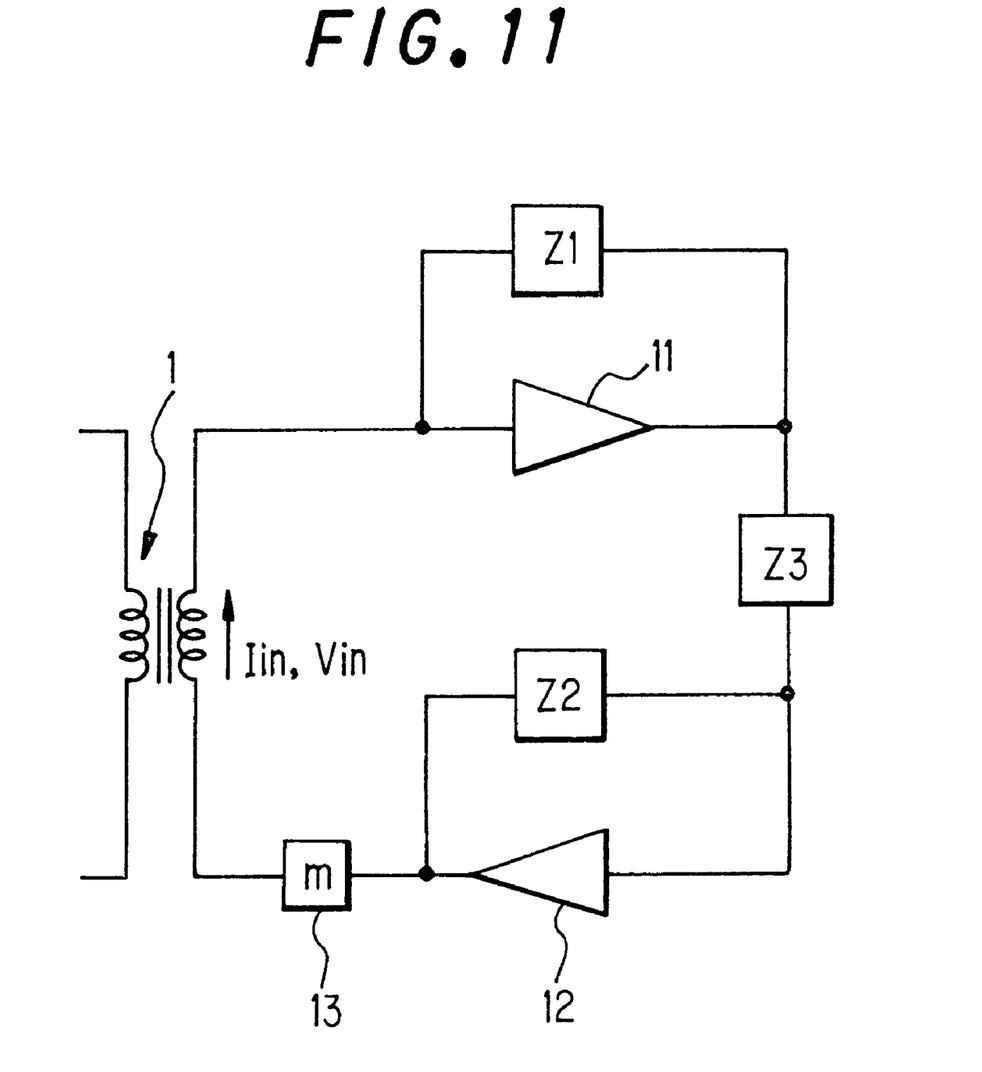
FIG. 11 is a circuit diagram showing the output signal converter for tube amplifiers according to another embodiment of the present invention.

FIG. 11 is a circuit diagram showing the constitution of the output signal converter according to the sixth embodiment of the present invention, and this output signal converter is constituted by containing first and second voltage amplifiers 11 and 12 having infinite amplification rate and a coefficient multiplier 13. Namely, the first voltage amplifier 11, a load Z3, the second voltage amplifier 12 and m-times coefficient multiplier 13 are connected in series at the secondary side of the output transformer 1, and a load Z1 is arranged in parallel to the first voltage amplifier 11, while a load Z2 is arranged in parallel to the second voltage amplifier 12. If an input current at the secondary side of the output transformer 1 is given as Iin and an input voltage is given as Vin, the following equation (9) can be given:

$$Iin*Z1*(Z2/Z3)*m+Vin=0 \tag{9}$$

According to the equation described above, an input impedance Zin can be given from the following equation (10):

$$Zin=Vin/Iin=-m*Z1*(Z2/Z3) \tag{10}$$

If a condition, Zin=Z2 is given, a correlation, m*(Z1/Z3)=-1 is required to be given, and when the load Z3 is the speaker 4, the voltage Vsp at both terminals of the speaker 4 shall be given according to the following equation (11):

$$Vsp=Iin*Z1*Z2/Z3 \tag{11}$$

Then, an amplification rate is given from an equation, Vsp/Vin, and the value obtained from this equation gets equal to −1/m. If m=0.316 is given, Z1=−1 and Z3 =0.316 are then given. Since an output level is proportional to a squared value of 1/m, an equation, $$(1/0.316)*(1/0.316)=10$$

is given, so that 10 times output can be obtainable.

Further, as described above, since Zin=Z2 and Z2 is the speaker 4, the input impedance Z2 at output signal converter and the impedance at the speaker 4 will be understood as equal, and therefore, the output signals can be either amplified or reduced with maintaining the output property obtainable by using the tube amplifier 5 which is provided at the front of the output transformer 1, as similar to the one according to the embodiment shown in FIG. 7.

What is claimed is:

1. An output signal converter for a tube amplifier comprising semiconductor devices for amplifying or attenuating an output signal of the tube amplifier while maintaining output properties of the tube amplifier, said output signal converter comprising:

an output transformer (TR) having an input terminal (TRa);

a first circuit branch (C1) connected between the input terminal (TRa) and an output terminal of the tube amplifier; and a second circuit branch (C2) connected to the input terminal (TRa) of the output transformer (TR) and in parallel to the first circuit branch, said second circuit branch including means for generating an electric current proportional to a current level in said first circuit branch;

wherein said first circuit branch and said second circuit branch are located between said tube amplifier and said output transformer (TR) and comprise semiconductor devices so that said output signal from said tube amplifier is amplified while maintaining the output properties of the tube amplifier.

2. The output signal converter as defined in claim 2, wherein said first circuit branch consists of a first resistance (R1, R11) and a first transistor (Q1, Q11) connected in series with each other, said second circuit branch consists of a second resistance (R2, R12) and a second transistor (Q2, Q12) connected in series with each other, said first transistor (Q1, Q11) has a base terminal connected to a node between the second resistance (R2, R12) and the second transistor (Q2, Q12) and said second transistor (Q2, Q12) has a base terminal connected to a node between the first transistor and the output terminal of the tube amplifier.

3. The output signal converter as defined in claim 2, further comprising a third transistor (Q13) connected in series between the second resistance (R12) and the second transistor (Q12) and also connected to the base terminal of the first transistor (Q11) to form a mirror circuit portion together with the first transistor.

4. The output signal converter as defined in claim 2, further comprising a diode (D1) connected between said second resistance (R2, R12) and said second transistor (Q2, Q12).

5. The output signal converter as defined in claim 2, wherein said second resistance (R2, R12) is a variable resistance.

6. An output signal converter for a tube amplifier comprising semiconductor devices for amplifying or attenuating an output signal of the tube amplifier while maintaining output properties of the tube amplifier, said tube amplifier comprising a first vacuum tube and a second vacuum tube and said output signal converter comprising an output transformer having a first input terminal and a second input terminal;

a first circuit branch connected between the first input terminal and an output terminal of the first vacuum tube;

a second circuit branch connected to the first input terminal of the output transformer and in parallel to the first circuit branch, said second circuit branch including means for generating an electric current proportional to a current level in said first circuit branch;

a third circuit branch connected between the second input terminal of the output transformer and an output terminal of the second vacuum tube;

a fourth circuit branch connected to the second input terminal of the output transformer and in parallel to the third circuit branch, said fourth circuit branch including means for generating an electric current proportional to the current level flowing in the first circuit branch;

wherein said first circuit branch, said second circuit branch, said third circuit branch and said fourth circuit branch are located between said tube amplifier and said output transformer and comprise semiconductor devices so that said output signal from said tube amplifier is amplified while maintaining the output properties of the tube amplifier.

7. The output signal converter as defined in claim 6, wherein said first circuit branch consists of a first resistance and a first transistor connected in series with each other, said second circuit branch consists of a second resistance and a second transistor connected in series with each other, said third circuit branch consists of a third resistance and a third transistor connected in series with each other, said fourth circuit branch consists of a fourth resistance and a fourth transistor connected in series with each other, said first transistor has a base terminal connected to a node between the second resistance and the second transistor, said second transistor has a base terminal connected to a node between the first transistor and the output terminal of the first vacuum tube, said third transistor has a base terminal connected to a node between the fourth transistor and the fourth resistance and said fourth transistor has a base terminal connected to a node between the third transistor and the output terminal of the second vacuum tube.

8. The output signal converter as defined in claim 7, further comprising a fifth transistor connected between the second resistance and the second transistor and also connected to the first transistor to form a current mirror circuit portion and a sixth transistor connected between the fourth resistance and the fourth transistor and also connected to the third transistor to form another current mirror circuit portion.

9. The output signal converter as defined in claim 7, further comprising a first diode connected between the second resistance and the second transistor and a second diode connected between the fourth resistance and the fourth transistor.

10. The output signal converter as defined in claim 7, wherein said second resistance and said fourth resistance are each variable.

* * * * *